(12) United States Patent
Chen et al.

(10) Patent No.: US 10,925,159 B2
(45) Date of Patent: Feb. 16, 2021

(54) CIRCUIT DEVICE

(71) Applicant: Dongguan Luxshare Technologies Co., Ltd, Dongguan (CN)

(72) Inventors: Qiong-Nan Chen, Dongguan (CN); Long Jin, Dongguan (CN); Bing-Bao Liu, Dongguan (CN); Xiao-Long Ding, Dongguan (CN)

(73) Assignee: Dongguan Luxshare Technologies Co., Ltd., Dongguan (CN)

( * ) Notice: Subject to any disclaimer, the term of this patent is extended or adjusted under 35 U.S.C. 154(b) by 0 days.

(21) Appl. No.: 16/883,564

(22) Filed: May 26, 2020

(65) Prior Publication Data

US 2020/0288572 A1    Sep. 10, 2020

(30) Foreign Application Priority Data

Nov. 11, 2019    (CN) .................... 2019 2 1933462 U

(51) Int. Cl.
*H05K 1/11*     (2006.01)
*H05K 1/18*     (2006.01)
*H01R 12/71*    (2011.01)

(52) U.S. Cl.
CPC .............. *H05K 1/11* (2013.01); *H01R 12/71* (2013.01); *H05K 1/18* (2013.01)

(58) Field of Classification Search
CPC .......... H01R 12/71; H01R 12/75; H05K 1/11; H05K 1/18
See application file for complete search history.

(56) References Cited

U.S. PATENT DOCUMENTS

| 2014/0041937 A1* | 2/2014 | Lloyd | H05K 1/0243 |
| | | | 174/74 R |
| 2015/0114694 A1* | 4/2015 | Liu | H05K 1/147 |
| | | | 174/255 |

FOREIGN PATENT DOCUMENTS

CN             209089278 U    *    7/2019

\* cited by examiner

*Primary Examiner* — Timothy J Thompson
*Assistant Examiner* — Amol H Patel
(74) *Attorney, Agent, or Firm* — Birch, Stewart, Kolasch & Birch, LLP

(57) ABSTRACT

A circuit device includes a circuit board having several contacts disposed on a first face of the circuit board and a connector disposed on a second face of the circuit board. The circuit board includes a hollow part, and the hollow part is defined through the circuit board from the first face of the circuit board to the second face of the circuit board. The circuit device includes several cables. One of two ends of each cable is on the first face of the circuit board and is connected to the corresponding contact, and the other end of each cable passes through the hollow part of the circuit board to the second face of the circuit board and extends outwardly.

13 Claims, 12 Drawing Sheets

CIRCUIT DEVICE

CROSS-REFERENCE TO RELATED APPLICATION

This non-provisional application claims priority under 35 U.S.C. § 119(a) to Patent Application No. 201921933462.3 filed in China, P.R.C. on Nov. 11, 2019, the entire contents of which are hereby incorporated by reference.

BACKGROUND

Technical Field

The instant disclosure relates to a circuit device and, more particularly, to a circuit device having a circuit board with cables on the circuit board.

Related Art

As electronic products become thinner and smaller, the area of circuit boards within the electronic products is reduced respectively, and the circuit layout area on the circuit board for current transmission decreases as well. The appearance of the circuit board and the wiring configurations in the electronic products are also different, depending on different types of the electronic products. Among them, a circuit board known to the inventor(s) is provided with a connector for docking another connector to achieve the function of extended connections and signal transmissions. Furthermore, many cables may be soldered onto the circuit board as well to achieve the function of extending connection, and may serve as inputs and/or outputs of power or signals. However, conventionally, cables and the connector(s) are located on the same side of the circuit board. As a result, configuring the cables and the connector(s) on the same side of the circuit board makes a compact layout of the cables and the connector(s), which is detrimental to the configuration of the cables. That is, since the cables and the connector(s) are all soldered on the same face of the circuit board, if the connector is disposed on the circuit board first, the space for the cables will be taken up. Under the condition that the surface area of the circuit board is limited, it is inconvenient to arrange cables.

SUMMARY

The instant disclosure provides a circuit device, including a circuit board and a plurality of cables. A plurality of contacts is on a first face of the circuit board and a connector is on a second face of the circuit board opposite to the first face. The circuit board includes a hollow part, and the hollow part is defined through the circuit board from the first face of the circuit board to the second face of the circuit board. One of two ends of each of the cables is on the first face of the circuit board and is connected to the corresponding contact. The other end of each of the cables passes through the hollow part of the circuit board, extends to the second face of the circuit board, and extends outwardly.

In one or some embodiments, the contacts are electrically connected to internal terminals of the connector via a trace of the circuit board.

In one or some embodiments, the contacts include a plurality of first contacts and a plurality of second contacts, and the cables include a plurality of first cable lines connected to the first contacts and a plurality of second cable lines connected to the second contacts.

In one or some embodiments, the first contacts are connected to two of the first cable lines, and the second contacts are connected to four of the second cable lines.

In one or some embodiments, the circuit board comprises a plurality of the hollow parts, and the hollow parts are provided for the cables passing therethrough.

In one or some embodiments, a long side direction of each of the hollow parts is perpendicular to a long side direction of the connector.

In one or some embodiments, each of the hollow parts is provided for at least four of the cables passing therethrough.

In one or some embodiments, a long side direction of each of the hollow parts is parallel to a long side direction of the connector.

In one or some embodiments, the hollow part is at a side edge of the circuit board.

In one or some embodiments, the hollow part is between a side edge of the circuit board and the connector, a side plate is between the side edge of the circuit board and the hollow part, and the side plate has a first width or a second width different from the first width.

According to one or some embodiments of the instant disclosure, one of two ends of each of the cables passes through the hollow part and extends to the back face of the circuit board (the connector is on the front face of the circuit board), and is soldered to the corresponding contact on the back face of the circuit board. The other end of each of the cables may pass through the hollow part, extend out of the front face of the circuit board, and further extend to any required portions adapted to be provided with the cable. The configuration is suitable for cable arrangement on the circuit board. Hence, the problem of compact layout issue of the circuit board where the cables and the connectors are on the same face of the circuit board, which results in the inconvenience for cable arrangement on the circuit board, can be properly improved.

BRIEF DESCRIPTION OF THE DRAWINGS

The disclosure will become more fully understood from the detailed description given herein below for illustration only, and thus not limitative of the disclosure, wherein.

DETAILED DESCRIPTION

In order to make the purposes, features, and advantages of this disclosure more understandable and implementable by those skilled in the relevant technical field, the technical features and implementation of the disclosure will be illustrated in the following description in accompany with the drawings. Embodiments will be provided for further explanation, but the following embodiments are not intend to limit the disclosure, and the figures in the following contents are used to express schematic idea related the features of the disclosure.

Figure 1:
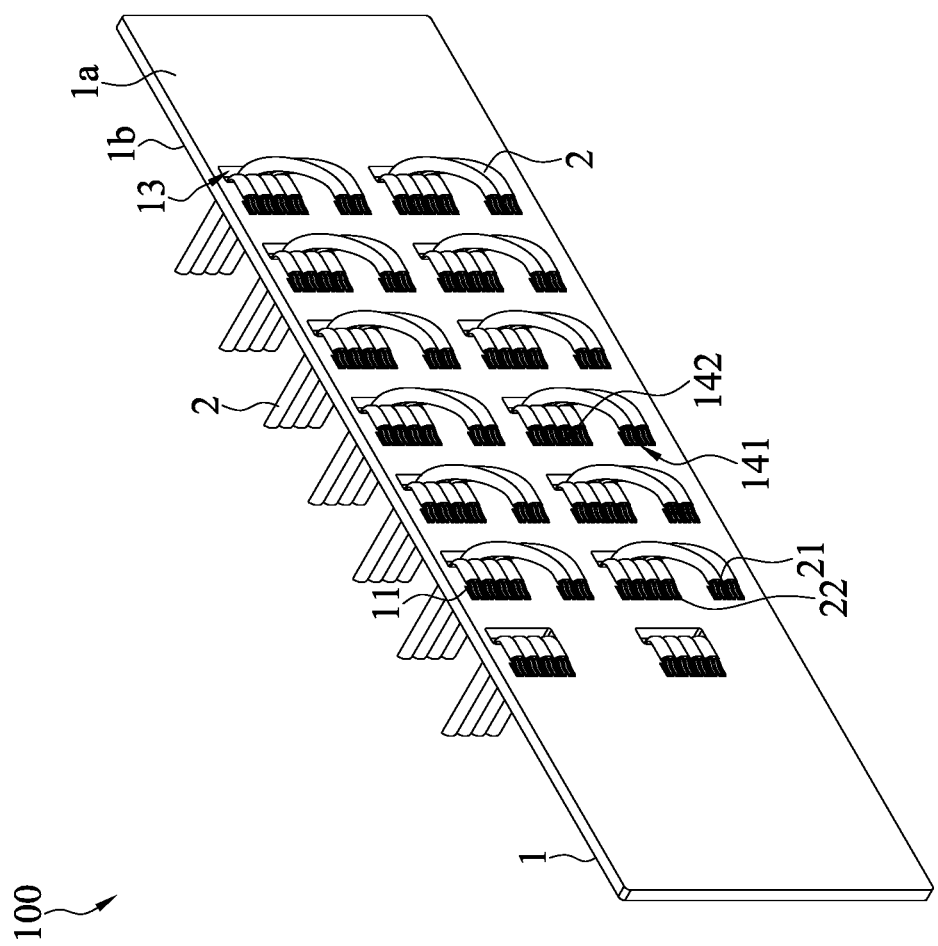
FIG. 1 illustrates a back perspective view of a circuit device according to a first embodiment of the instant disclosure.
Figure 2:
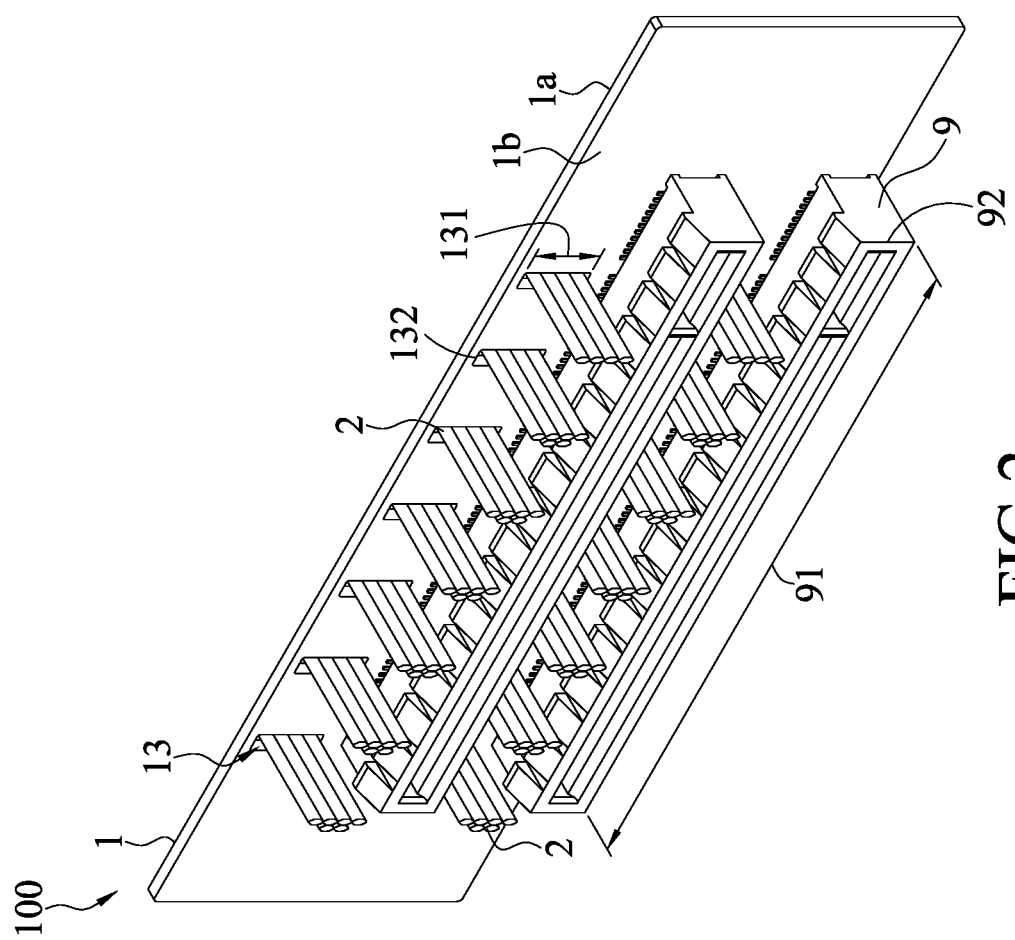
FIG. 2 illustrates a front perspective view of the circuit device of the first embodiment.
Figure 3:
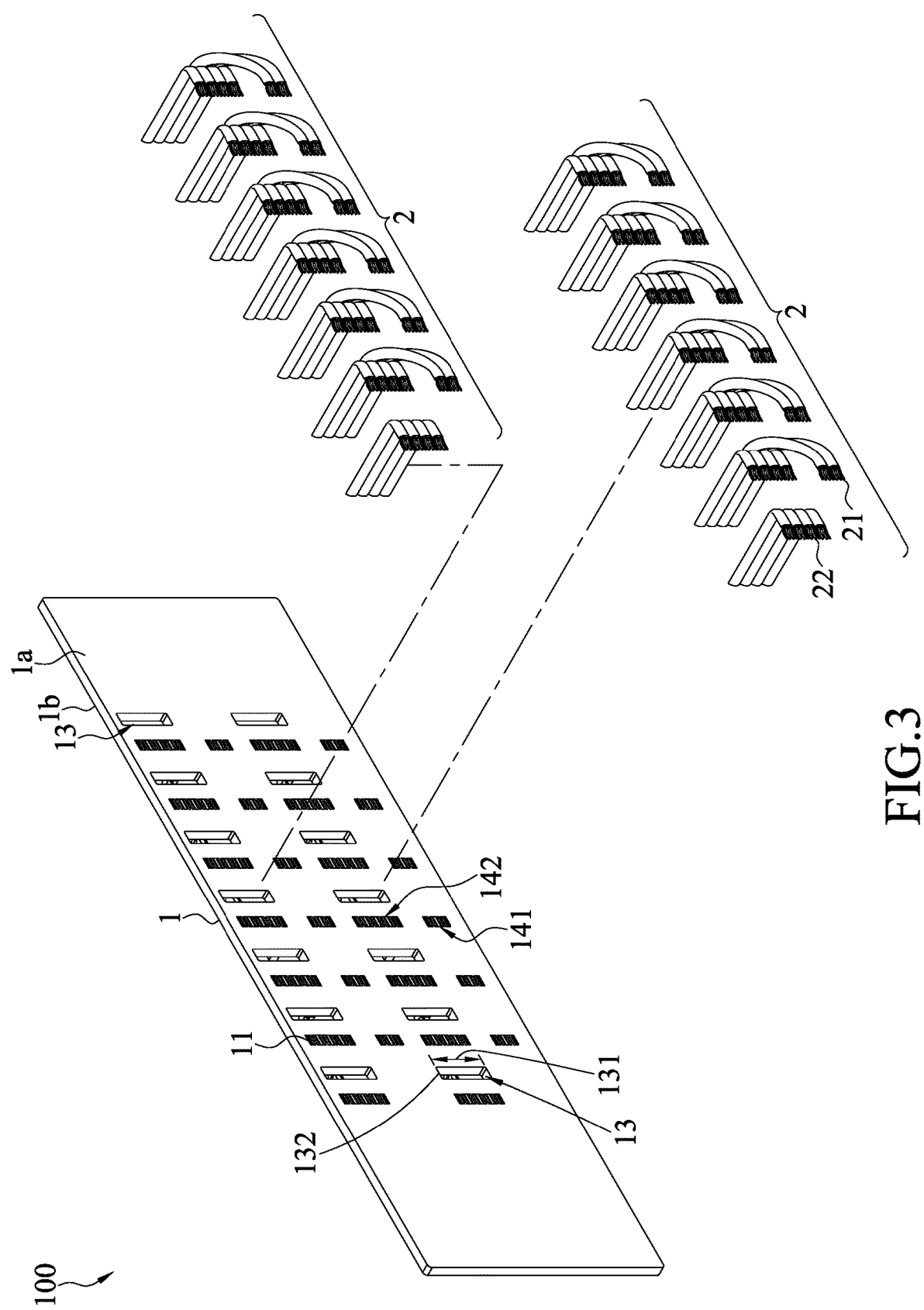
FIG. 3 illustrates an exploded view of the circuit device of the first embodiment.

Referring to FIG. 1, FIG. 2, and FIG. 3. FIG. 1 illustrates is a back perspective view of a circuit device in accordance with a first embodiment of the instant disclosure. FIG. 2 illustrates a front perspective view of the circuit device in accordance with the first embodiment. FIG. 3 illustrates an exploded view of the circuit device in accordance with the first embodiment. In this embodiment, the circuit device 100 includes a circuit board 1 and a plurality of cables 2.

In the first embodiment, a plurality of contacts 11 is disposed on a first face of the circuit board 1 and a connector 9 (may be a receptacle connector or a plug connector) is disposed on a second face of the circuit board 1 opposite to the first face. The circuit board 1 includes a hollow part 13, and the hollow part 13 is defined through the circuit board 1 from the first face 1a of the circuit board 1 to the second face 1b of the circuit board 1.

In the first embodiment, one of two ends of each of the cables 2 is on the first face 1a of the circuit board 1 and is connected to the corresponding contact 11, and the other end of each of the cables 2 passes through the hollow part 13 of the circuit board 1, extends to the second face 1b of the circuit board 1, and extends outwardly.

More specifically, in the first embodiment, two connectors 9 are disposed on the second face 1b of the circuit board 1, and seven hollow parts 13 (slots) are disposed at a side of each of the two adjacent connectors 9, but embodiments are not limited thereto. In some embodiments, one or more than three connectors 9 may be disposed on the second face 1b of the circuit board 1, and one hollow part 13 or a plurality of hollow parts 13 (slots) and corresponding cables 2 may be disposed at a side of each of the two adjacent connectors 9. In some other embodiments, one hollow part 13 or a plurality of hollow parts 13 (slots) and corresponding cables 2 may be disposed on the circuit board 1 but not adjacent to each of the two connectors 9. In some embodiments, one or more hollow parts 13 (slots) and corresponding cables 2 may be disposed on any place of the circuit board 1.

In the first embodiment, the width of the hollow part 13 may be configured to allow a single row of cable 2 or multiple rows of cables 2 to pass therethrough.

Generally speaking, in the first embodiment, one of two ends of the cable 2 may be electrically connected to the connector 9 (which may be a receptacle connector) on the circuit board 1 (which may be a printed circuit board, PCB). The other end of the cable 2 may be bent to pass through the hollow part 13 of the circuit board 1 (PCB) and extend outwardly. The other end of the cable 2 may extend to any required portions adapted to be provided with the cable 2; for example, the other end of the cable 2 may be connected to another corresponding connector or may be connected to any electronic components.

More specifically, in the first embodiment, the contacts 11 are electrically connected to a trace of the circuit board 1 connected to internal terminals of the connector 9, and thus the contacts 11 are electrically connected to the internal terminals of the connector 9 via the trace of the circuit board 1. Moreover, the contacts 11 include a plurality of first contacts 141 and a plurality of second contacts 142. The cables 2 include a plurality of first cable lines 21 connected to the first contacts 141 and a plurality of second cable lines 22 connected to the second contacts 142. In the first embodiment, the first contacts 141 and the second contacts 142 are separated from each other. For example, the first contacts 141 that are corresponding to the same hollow part 13 are disposed side by side and are closely arranged with each other, the second contacts 142 that are corresponding to the same hollow part 13 are disposed side by side and are closely arranged with each other, and the first contacts 141 and the second contacts 142 that are corresponding to the same hollow part 13 are disposed at the same row but spaced apart from each other by an interval. In some embodiments, the first contacts 141 and the second contacts 142 are misaligned, which will be further illustrated later.

In the first embodiment, more specifically, the first contacts 141 are connected to two of the first cable lines 21, and the second contacts 142 are connected to four of the second cable lines 22. The number of the first cable lines 21 and that of the second cable lines 22 correspond to the number of one set of terminals among several sets of terminals inside the connector 9. The two of the first cable lines 21 and the four of the second cable lines 22 may pass through the same hollow part 13, but embodiments are not limited thereto. In one or some embodiments, according to the number of the terminals inside the connector 9 and the trace configuration of the circuit board 1, the number of the cables 2 passing through one hollow part 13 may be two, three, four, or so on, and one or more than one hollow parts 13 may be on the circuit board 1.

In the first embodiment, more specifically, the first contact 141 and the second contact 142 are configured to be spaced apart from each other, and the first cable lines 21 and the second cable lines 22 are soldered to the first contacts 141 and the second contacts 142, respectively. Hence, the head ends of the first cable lines 21 and the head ends of the second cable lines 22 may thus be spaced apart from each other correspondingly, facilitating in the cable configuration on the circuit board 1 (PCB), and avoiding the mutual interferences between the head ends of the first cable lines 21 and the head ends of the second cable lines 22 during the soldering process.

In the first embodiment, more specifically, the circuit board 1 includes a plurality of hollow parts 13. Each of the hollow parts 13 is provided for the cables 2 passing therethrough. Here, each of the hollow parts 13 is provided for at least four of the cables 2 to pass through.

In the first embodiment, more specifically, when the circuit device 100 is observed from the front face, each hollow part 13 is a rectangular slot hole having two long side directions 131 and two short side directions 132. Each connector 9 has a rectangular body, and the rectangular body has two long side directions 91 and two short side directions 92.

In the first embodiment, more specifically, when the circuit device 100 is observed from the front face, the long side direction 131 of each of the hollow parts 13 is perpendicular to the long side direction 91 of the connector 9, but embodiments are not limited thereto. Moreover, when the long side direction 131 of each of the hollow parts 13 is perpendicular to the long side direction 91 of the connector 9, the cables 2 passing through the hollow part 13 are also aligned in a straight line, and the arrangement direction of the cables 2 (the direction of the straight line) is perpendicular to the long side direction 91 of the connector 9. For example, the arrangement direction of the first cables 21 passing through one hollow part 13 is perpendicular to the long side direction 91 of the connector 9, and the arrangement direction of the second cables 22 passing through the same hollow part 13 is perpendicular to the long side direction 91 of the connector 9.

Figure 4:
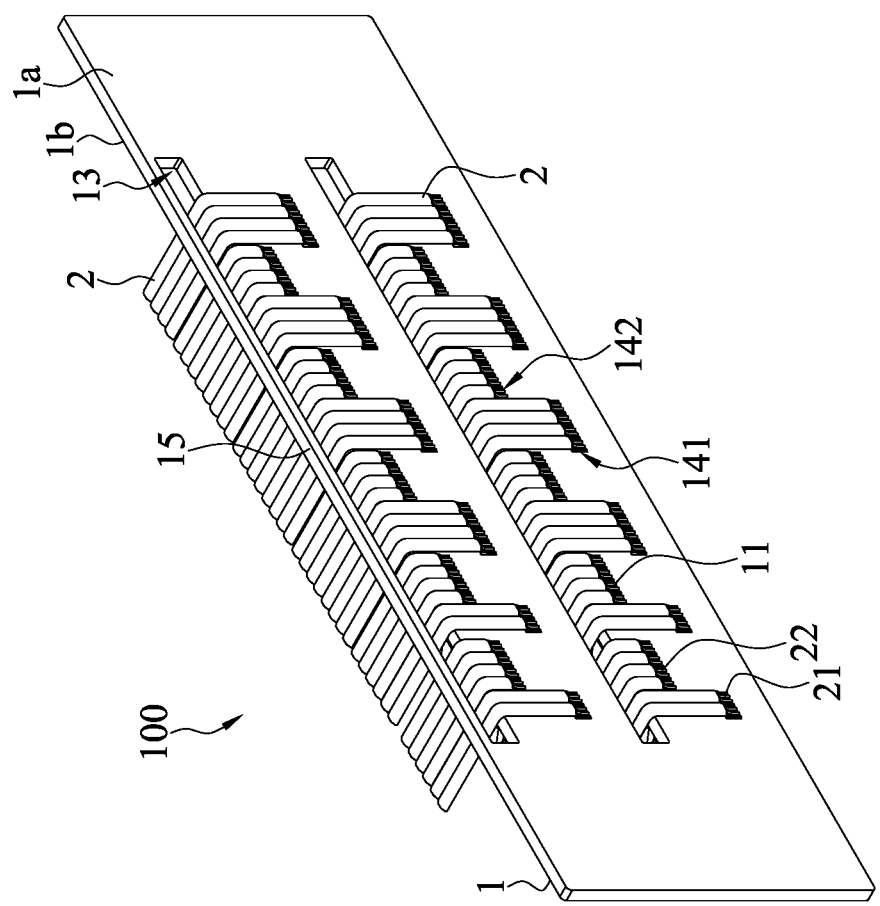
FIG. 4 illustrates a back perspective view of a circuit device according to a second embodiment of the instant disclosure.
Figure 5:
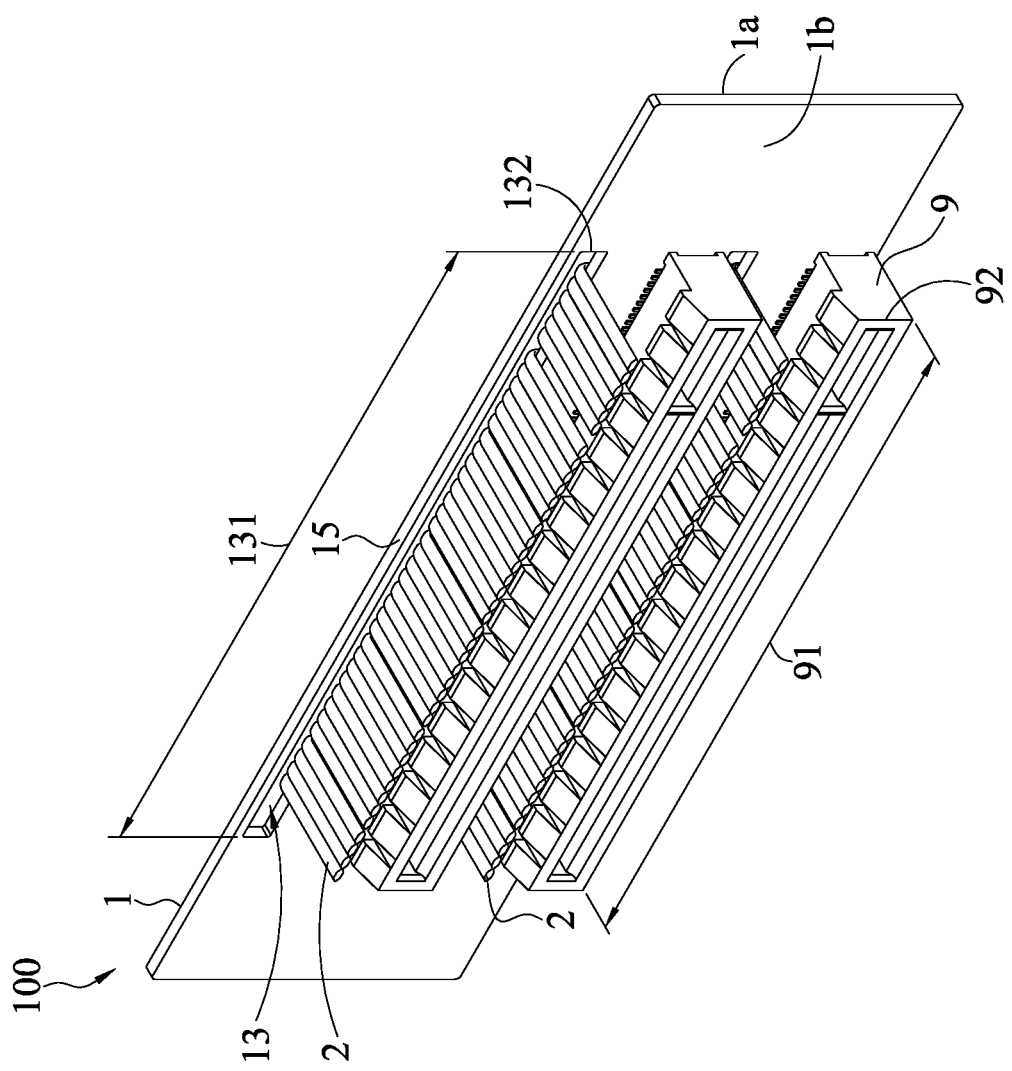
FIG. 5 illustrates a front perspective view of the circuit device of the second embodiment.
Figure 6:
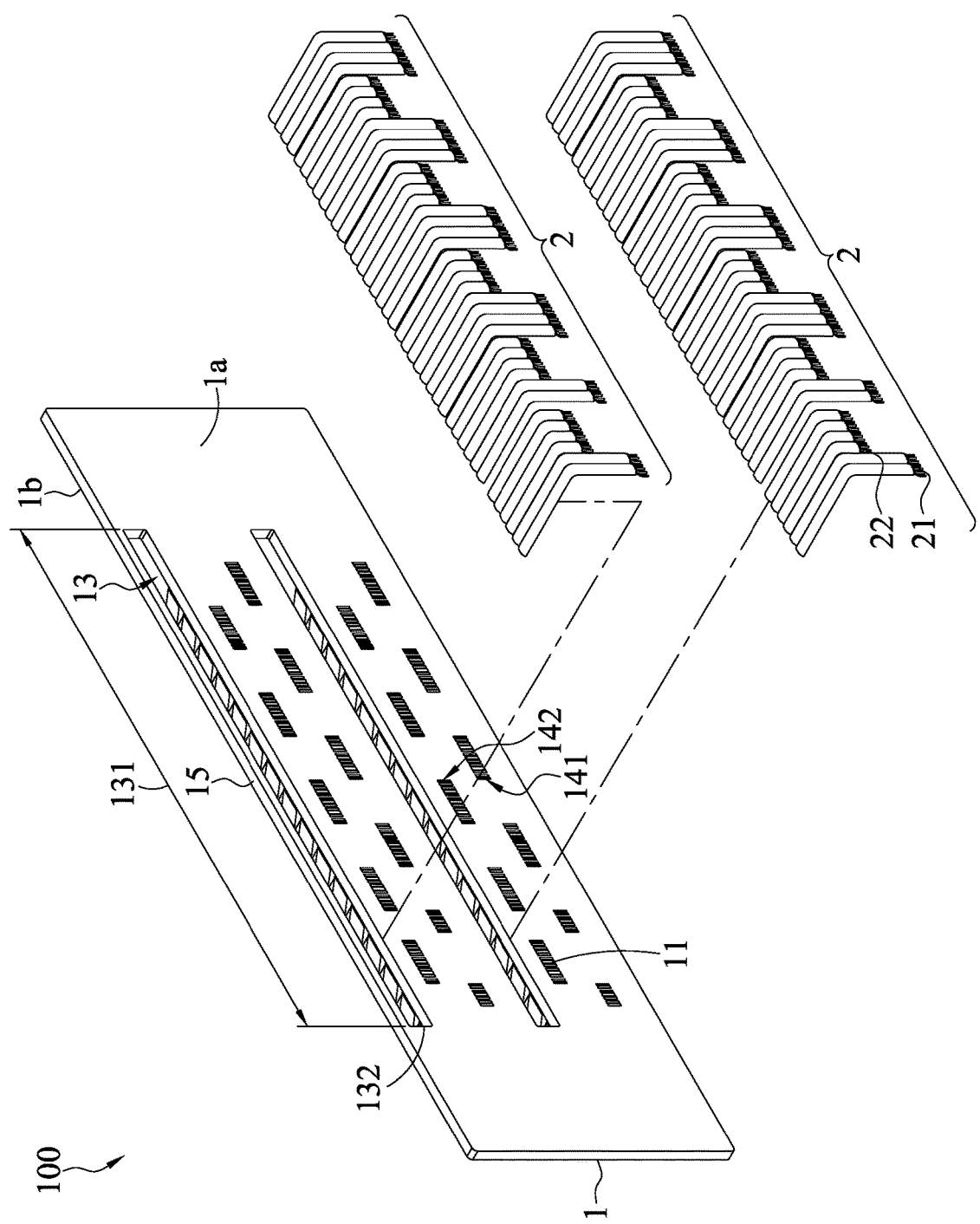
FIG. 6 illustrates an exploded view of the circuit device of the second embodiment.

Referring to FIG. 4, FIG. 5, and FIG. 6. FIG. 4 illustrates a back perspective view of a circuit device in accordance with a second embodiment of the instant disclosure. FIG. 5 illustrates a front perspective view of the circuit device in accordance with the second embodiment. FIG. 6 illustrates an exploded view of the circuit device in accordance with the second embodiment. In the second embodiment, the long direction 131 of each of the hollow parts 13 is parallel to a long side direction 91 of the connector 9 (upon being observed from the front face of the circuit device 100). Moreover, the length of the long direction 131 of each of the hollow parts 13 is approximately equal to the length of the long side direction 91 of the connector 9, and the hollow part 13 is capable of allowing cables 2 to pass therethrough and extend outwardly. Here, two connectors 9 are on the second face 1b of the circuit board 1, and one hollow part 13 (slot) is at a side of each of the two adjacent connectors 9. The length of the long side direction 131 of each of the hollow parts 13 is approximately equal to the length of the long side direction 91 of the connector 9. In some embodiments, one connector 9 or three connectors 9 may be on the second face 1b of the circuit board 1, and one hollow part 13 is at a side of the connector 9, or one hollow part 13 is at a side of each of the three connectors 9.

In the second embodiment, the hollow part 13 is parallel to the connector 9, and the cables 2 are arranged in a horizontal direction. That is, the cables 2 passing through the hollow part 13 are also arranged in a horizontal direction. The cables 2 and the connector 9 are arranged side by side and parallel to each other. The arrangement may be convenient for production.

In the second embodiment, more specifically, some hollow parts 13 are at a side portion of the circuit board 1. In other words, some hollow parts 13 are close to a side edge (i.e., the outward edge of the side portion) of the circuit board 1. Here, one of the hollow parts 13 is between the side edge of the circuit board 1 and the corresponding connector 9. A side plate 15 is between the side edge of the circuit board 1 and the hollow part 13, and the side plate 15 has a first width in the short side direction 132. The side plate 15 is at a side portion of the hollow part 13.

In second embodiment, the first contacts 141 and the second contacts 142 are misaligned. For example, the first contacts 141 and the second contacts 142 that correspond to the same hollow part 13 are arranged side by side and are closely arranged with each other, but the first contacts 141 and the second contacts 142 that correspond to the same hollow part 13 are misaligned and are not arranged on the same straight line. However, the first cable lines 21 and the second cable lines 22 that correspond to the same hollow part 13 are arranged on the same straight line while the first and second cable lines 21, 22 pass through the hollow part 13.

Figure 7:
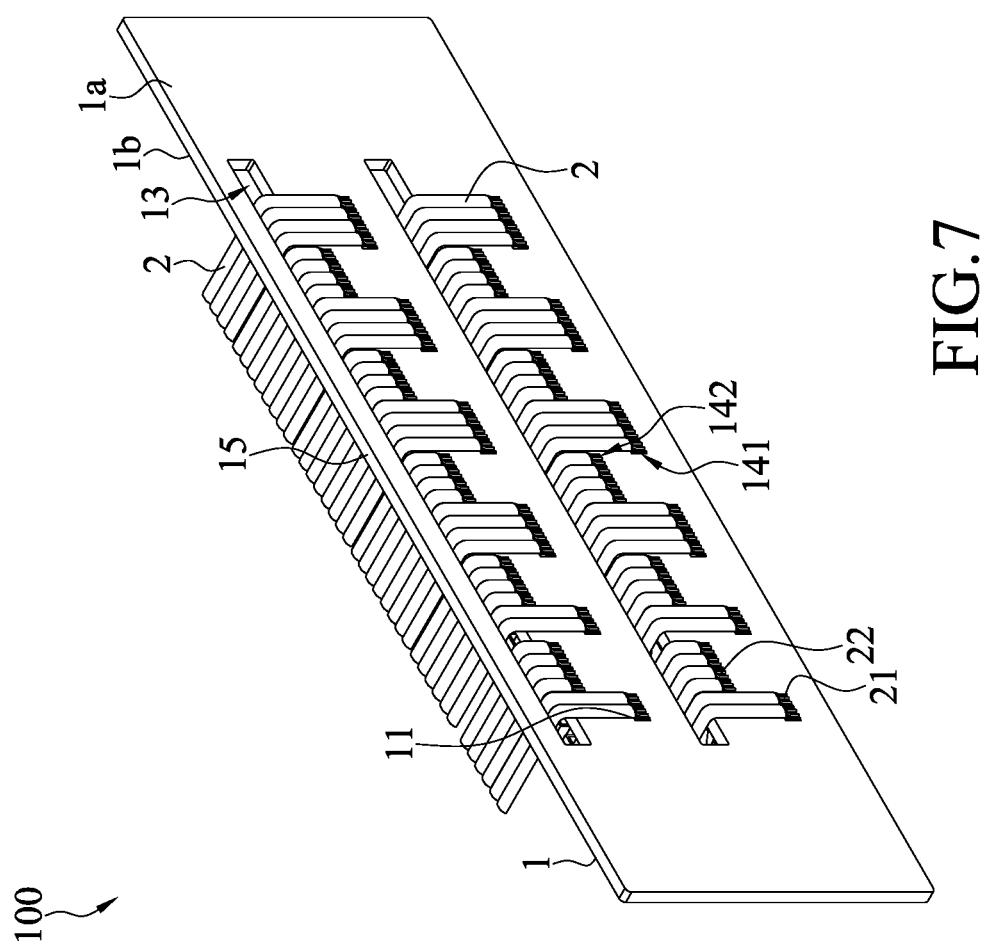
FIG. 7 illustrates a back perspective view of a circuit device according to a third embodiment of the instant disclosure.
Figure 8:
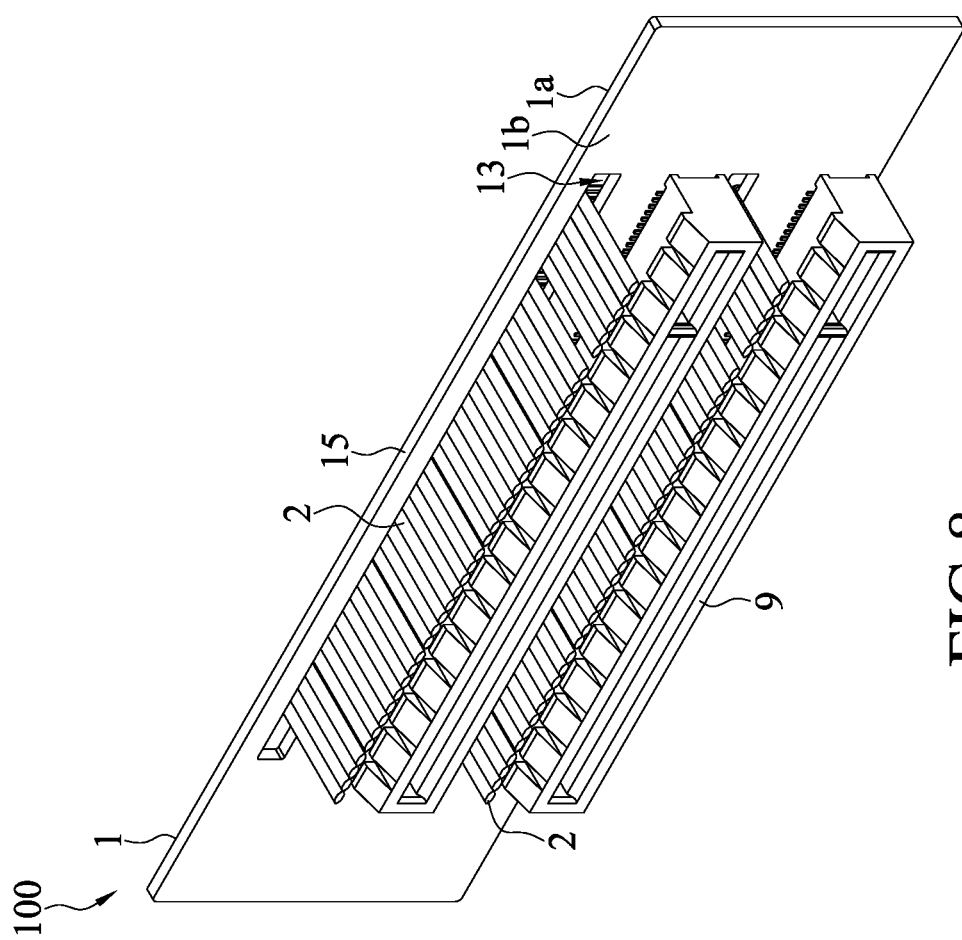
FIG. 8 illustrates a front perspective view of a circuit device according to the third embodiment.
Figure 9:
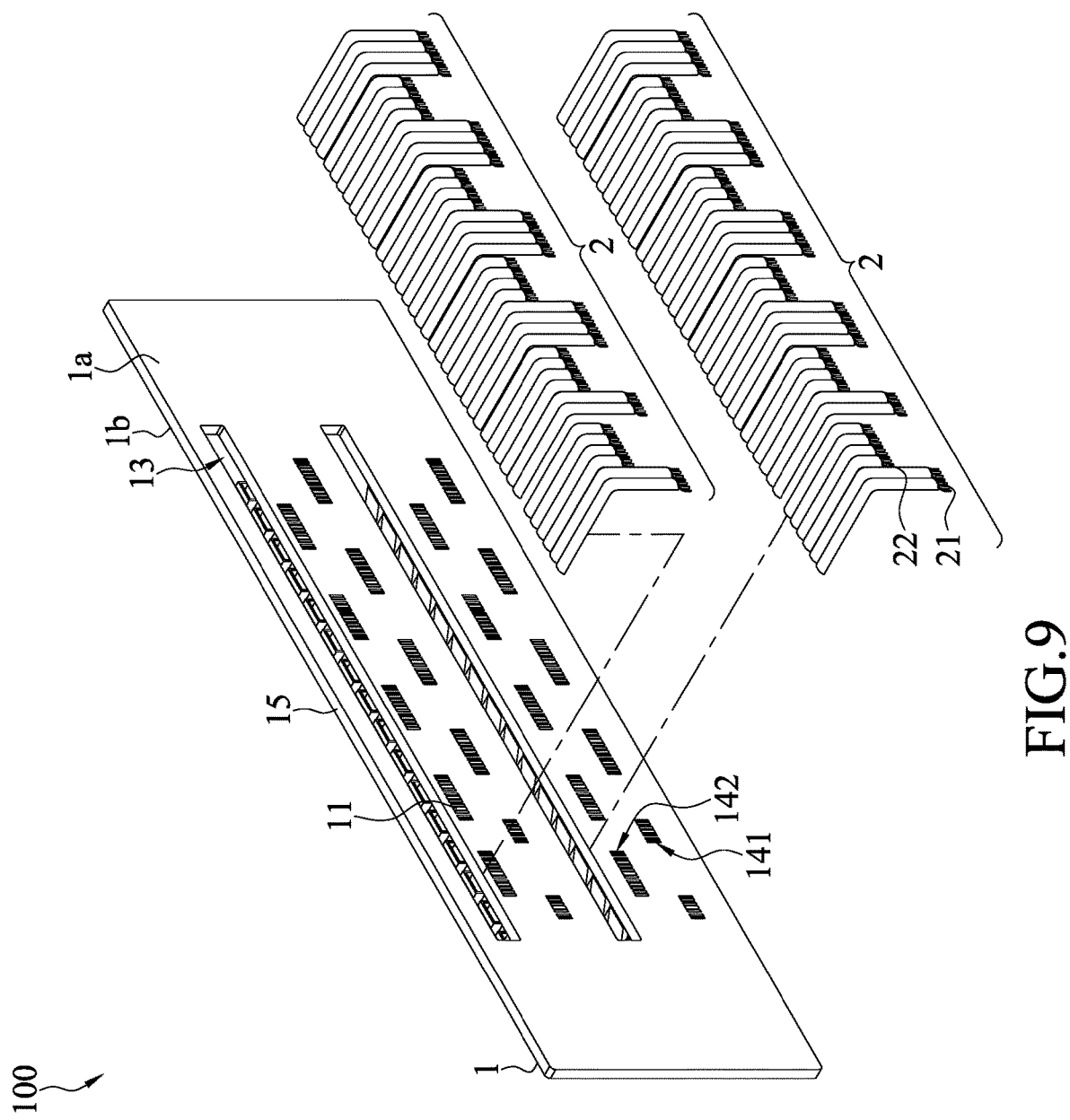
FIG. 9 illustrates an exploded view of the circuit device of the third embodiment.

Referring to FIG. 7, FIG. 8, and FIG. 9. FIG. 7 illustrates a back perspective view of a circuit device in accordance with a third embodiment of the instant disclosure. FIG. 8 illustrates a front perspective view of the circuit device in accordance with the third embodiment. FIG. 9 illustrates an exploded view of the circuit device in accordance with the third embodiment. In the third embodiment, some of the hollow parts 13 are at a side portion of the circuit board 1, meaning that some of the hollow parts 13 is close to a side edge of the circuit board 1. Here, one of the hollow parts 13 is between the side edge of the circuit board 1 and the corresponding connector 9. A side plate 15 is between the hollow part 13 and the side edge of the circuit board 1. The side plate 15 has a second width in the short side direction 132 (referring to FIG. 5 and FIG. 6), and the side plate 15 is at the side of the hollow part 13. The second width is different from the first width. More specifically, in this embodiment, the second width is larger than the first width.

Figure 10:
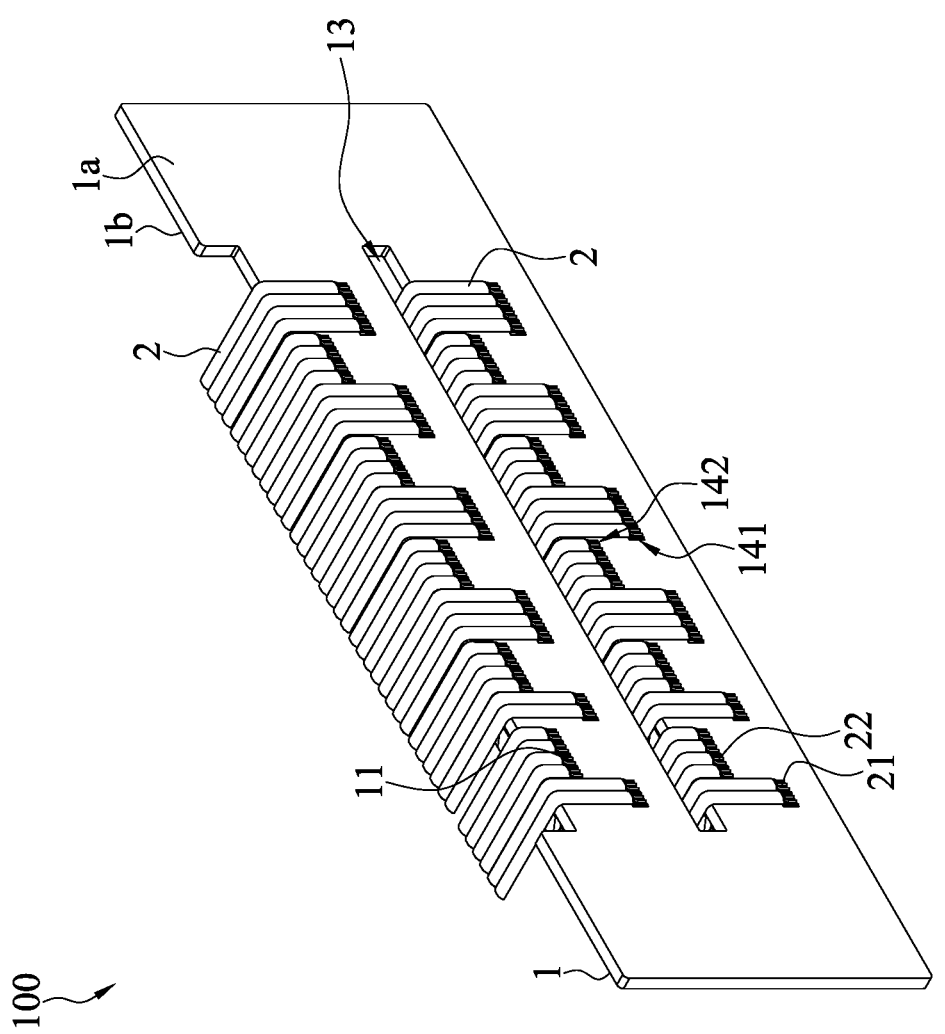
FIG. 10 illustrates a back perspective view of a circuit device according to a fourth embodiment of the instant disclosure.
Figure 11:
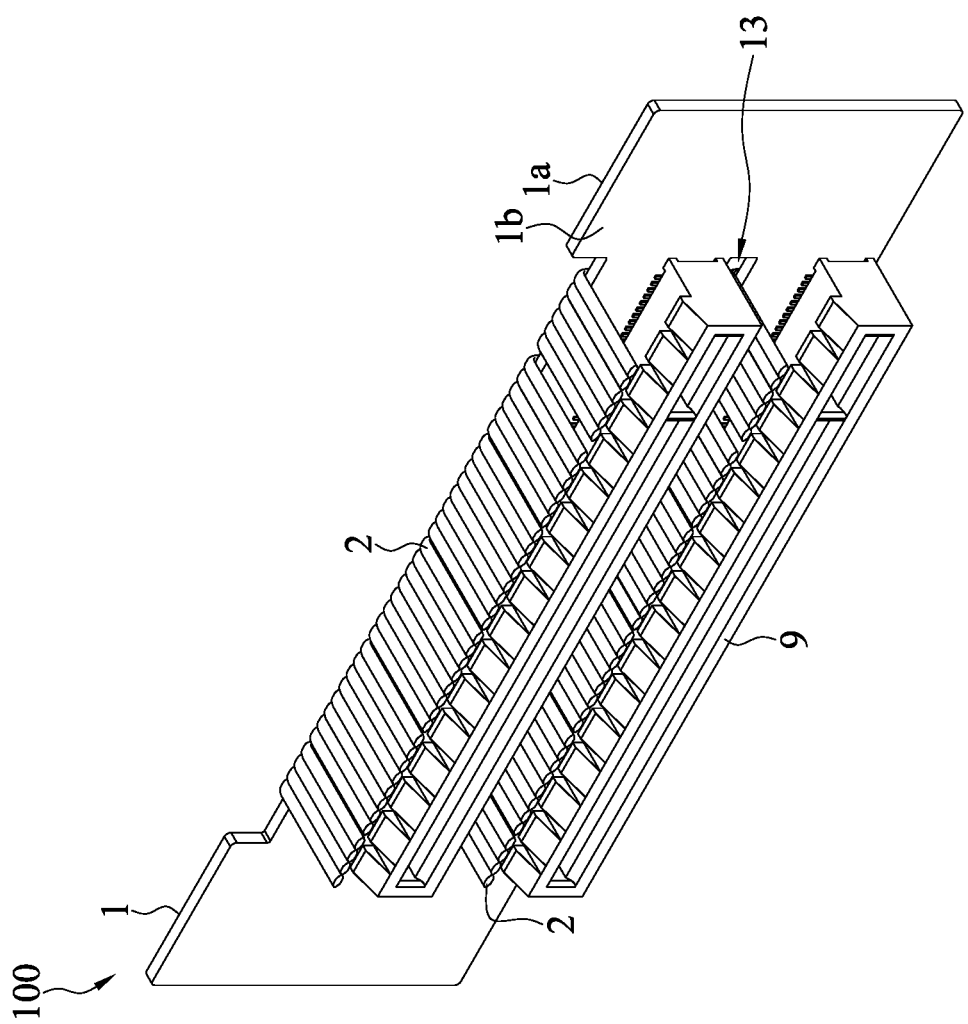
FIG. 11 illustrates a front perspective view of the circuit device of the fourth embodiment.
Figure 12:
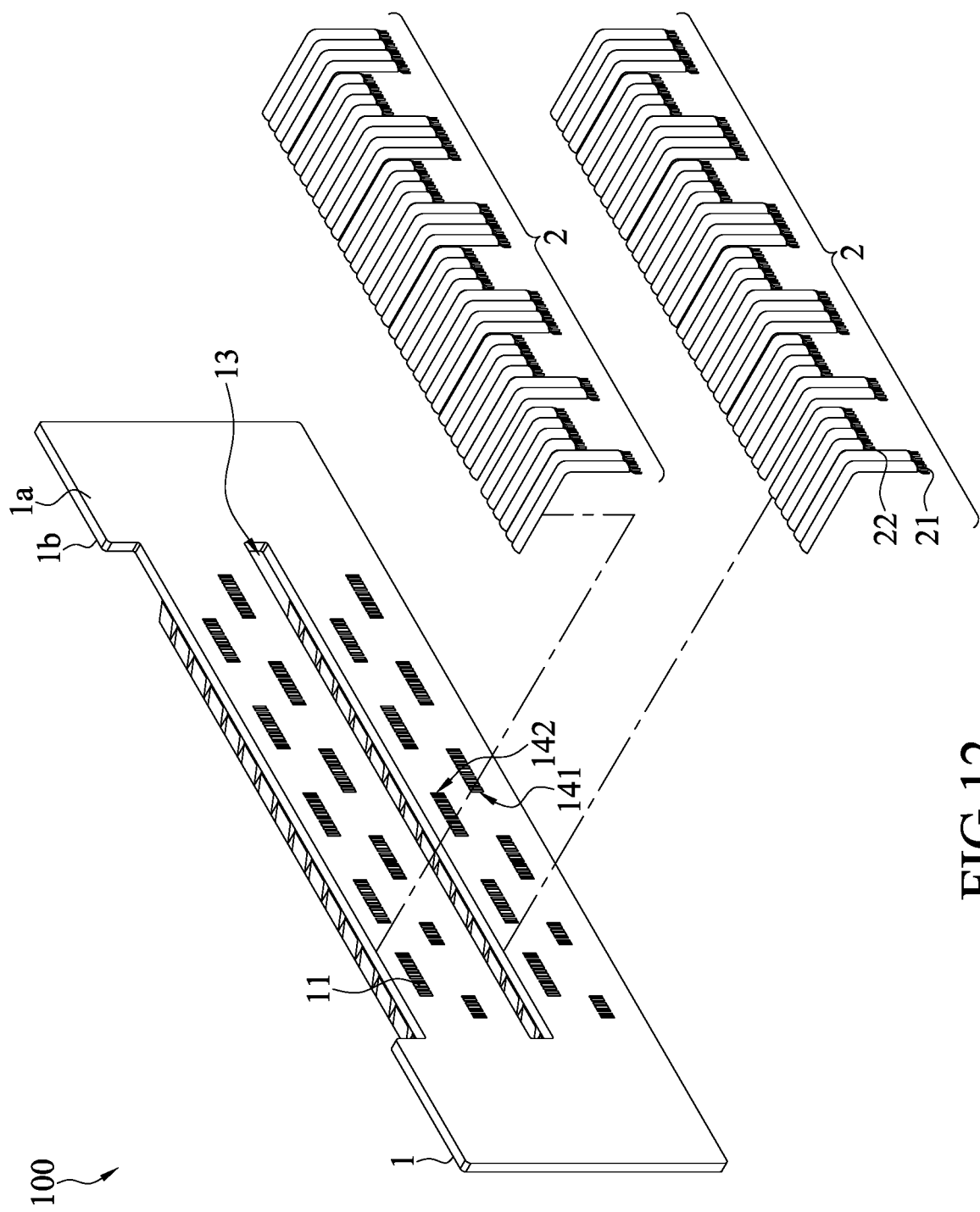
FIG. 12 illustrates an exploded view of the circuit device of the fourth embodiment.

Referring to FIG. 10, FIG. 11, and FIG. 12. FIG. 10 illustrates a back perspective view of a circuit device in accordance with a fourth embodiment of the instant disclosure. FIG. 11 illustrates a front perspective view of the circuit device in accordance with the fourth embodiment. FIG. 12 illustrates an exploded view of the circuit device in accordance with the fourth embodiment. In the fourth embodiment, some of the hollow parts 13 are formed on the side edge of the circuit board 1. The hollow part 13 is recessed at the side edge of the circuit board 1 and thus a groove is formed. The cables 2 pass through the hollow part 13, extend to the second face 1b of the circuit board 1, and extend outwardly.

According to one or some embodiments of the instant disclosure, one of two ends of each of the cables passes through the hollow part and extends to the back face of the circuit board (the connector is on the front face of the circuit board), and is soldered to the corresponding contact on the back face of the circuit board. The other end of each of the cables may pass through the hollow part, extend out of the front face of the circuit board, and further extend to any required portions adapted to be provided with the cable. The configuration is suitable for cable arrangement on the circuit board. Hence, the problem of compact layout issue of the circuit board where the cables and the connectors are on the same face of the circuit board, which results in the inconvenience for cable arrangement on the circuit board, can be properly improved.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:
1. A circuit device, comprising:
a circuit board, having a plurality of contacts on a first face of the circuit board and a connector on a second face of the circuit board opposite to the first face, wherein the contacts comprise a plurality of first contacts and a plurality of second contacts, the circuit board comprises a hollow part, and the hollow part is defined through the circuit board from the first face of the circuit board to the second face of the circuit board; and a plurality of cables, wherein one of two ends of each of the cables is on the first face of the circuit board and is connected to the corresponding contact, the other end of each of the cables passes through the hollow part of the circuit board, extends to the second face of the circuit board, and extends outwardly, and the cables comprise a plurality of first cable lines connected to the first contacts and a plurality of second cable lines connected to the second contacts.

2. The circuit device according to claim 1, wherein the contacts are electrically connected to internal terminals of the connector via a trace of the circuit board.

3. The circuit device according to claim 2, wherein the first contacts are connected to two of the first cable lines, and the second contacts are connected to four of the second cable lines.

4. The circuit device according to claim 2, wherein the circuit board comprises a plurality of the hollow parts, and the hollow parts are provided for the cables passing therethrough.

5. The circuit device according to claim 4, wherein a long side direction of each of the hollow parts is perpendicular to a long side direction of the connector.

6. The circuit device according to claim 5, wherein each of the hollow parts is provided for at least four of the cables passing therethrough.

7. The circuit device according to claim 1, wherein the first contacts are connected to two of the first cable lines, and the second contacts are connected to four of the second cable lines.

8. The circuit device according to claim 1, wherein the circuit board comprises a plurality of the hollow parts, and the hollow parts are provided for the cables passing therethrough.

9. The circuit device according to claim 8, wherein a long side direction of each of the hollow parts is perpendicular to a long side direction of the connector.

10. The circuit device according to claim 9, wherein each of the hollow parts is provided for at least four of the cables passing therethrough.

11. The circuit device according to claim 1, wherein a long side direction of the hollow part is parallel to a long side direction of the connector.

12. The circuit device according to claim 11, wherein the hollow part is formed on a side edge of the circuit board.

13. The circuit device according to claim 11, wherein the hollow part is between a side edge of the circuit board and the connector, a side plate is between the side edge of the circuit board and the hollow part, and the side plate has a first width or a second width different from the first width.

* * * * *